(12) United States Patent
Demone

(10) Patent No.: US 6,785,176 B2
(45) Date of Patent: Aug. 31, 2004

(54) METHOD AND APPARATUS FOR ACCELERATING SIGNAL EQUALIZATION BETWEEN A PAIR OF SIGNAL LINES

(75) Inventor: Paul Demone, Kanata (CA)

(73) Assignee: Mosaid Technologies Incorporated, Kanata (CA)

( * ) Notice: Subject to any disclaimer, the term of this patent is extended or adjusted under 35 U.S.C. 154(b) by 0 days.

(21) Appl. No.: 10/336,851

(22) Filed: Jan. 6, 2003

(65) Prior Publication Data

US 2003/0142567 A1 Jul. 31, 2003

Related U.S. Application Data

(63) Continuation of application No. PCT/CA00/01008, filed on Aug. 31, 2000.
(60) Provisional application No. 60/216,680, filed on Jul. 7, 2000.

(30) Foreign Application Priority Data

Jul. 7, 2000 (CA) .............................................. 2313951

(51) Int. Cl.[7] ................................................. G11C 7/00
(52) U.S. Cl. ....................................... 365/202; 365/203
(58) Field of Search ............................... 365/202, 203, 365/205, 207, 208, 63, 190

(56) References Cited

U.S. PATENT DOCUMENTS

| | | | |
|---|---|---|---|
| 5,233,558 A | * 8/1993 | Fujii et al. ............. | 365/189.01 |
| 5,247,482 A | 9/1993 | Kim | |
| 5,291,433 A | * 3/1994 | Itoh ............................. | 365/63 |
| 5,349,560 A | 9/1994 | Suh et al. | |
| 5,623,446 A | 4/1997 | Hisada | |
| 5,673,219 A | 9/1997 | Hashimoto | |
| 5,717,645 A | * 2/1998 | Kengeri et al. ......... | 365/230.01 |
| 5,757,707 A | * 5/1998 | Abe ........................... | 365/203 |
| 6,023,437 A | 2/2000 | Lee | |
| 6,166,976 A | * 12/2000 | Ong ........................... | 365/203 |
| 6,278,650 B1 | * 8/2001 | Kang .................... | 365/230.03 |
| 6,307,768 B1 | * 10/2001 | Zimmermann ............... | 365/51 |

\* cited by examiner

*Primary Examiner*—Son Mai
(74) *Attorney, Agent, or Firm*—Kevin Pillay; Ogilvy Renault

(57) ABSTRACT

A circuit is provided for equalizing a signal between a pair of bit lines. The circuit comprises a first equalizing element that is operatively coupled between the pair of bit lines for equalizing the signal, the first equalizing element being located proximate a first end of the pair of bit lines. The circuit further comprises a precharging element that is operatively coupled between the pair of bit lines for precharging the pair of bit lines to a precharge voltage, the precharging element being located proximate to the first equalizing element. The circuit also comprises a second equalizing element that is operatively coupled between the pair of bit lines for equalizing the signal, and located at a predetermined position along the bit lines. As a result of having multiple equalizing elements located along pairs of bit lines, the precharge and equalize function is performed faster than in conventional approaches.

14 Claims, 8 Drawing Sheets

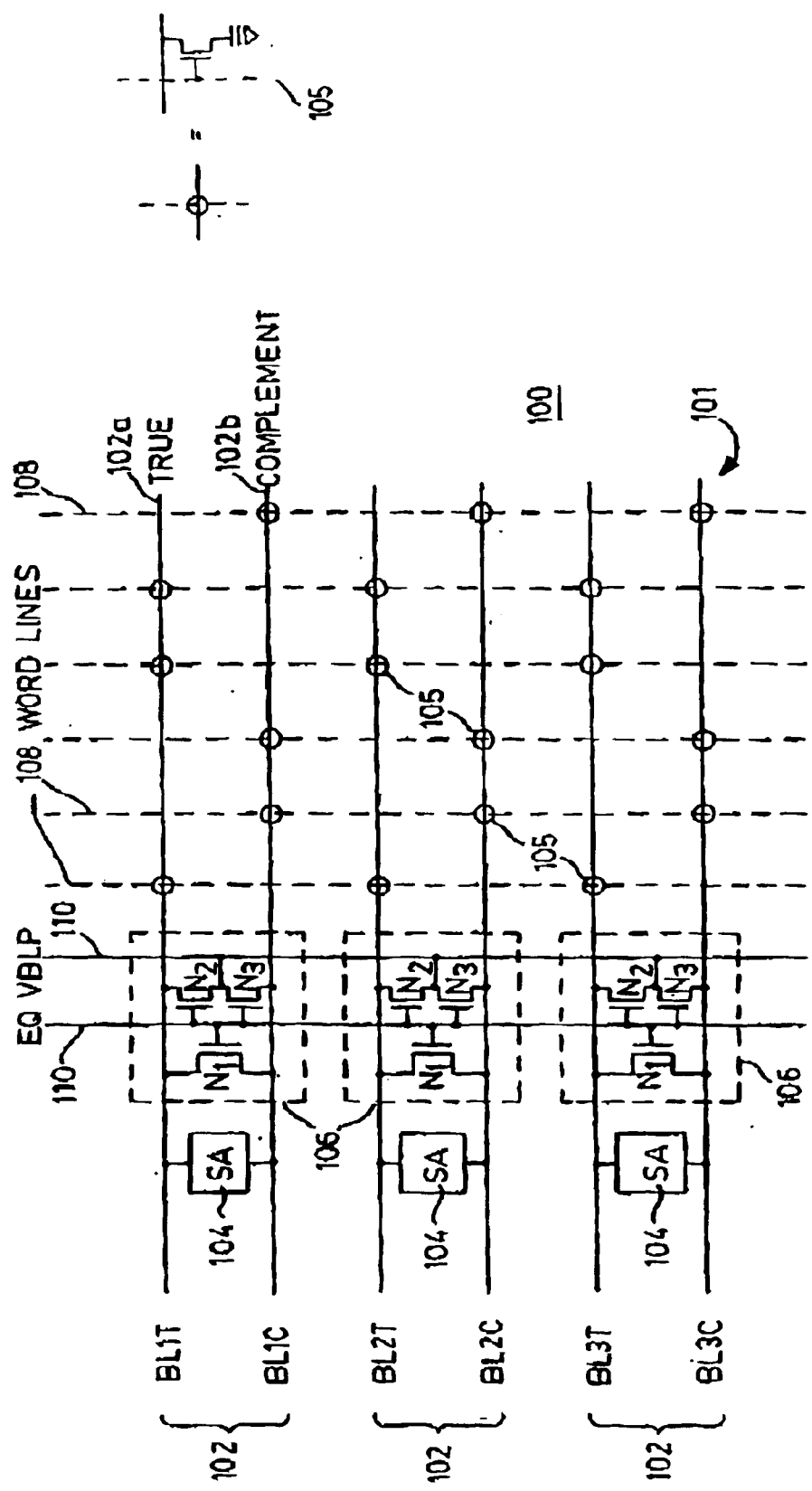
FIG. 1a — Prior Art —

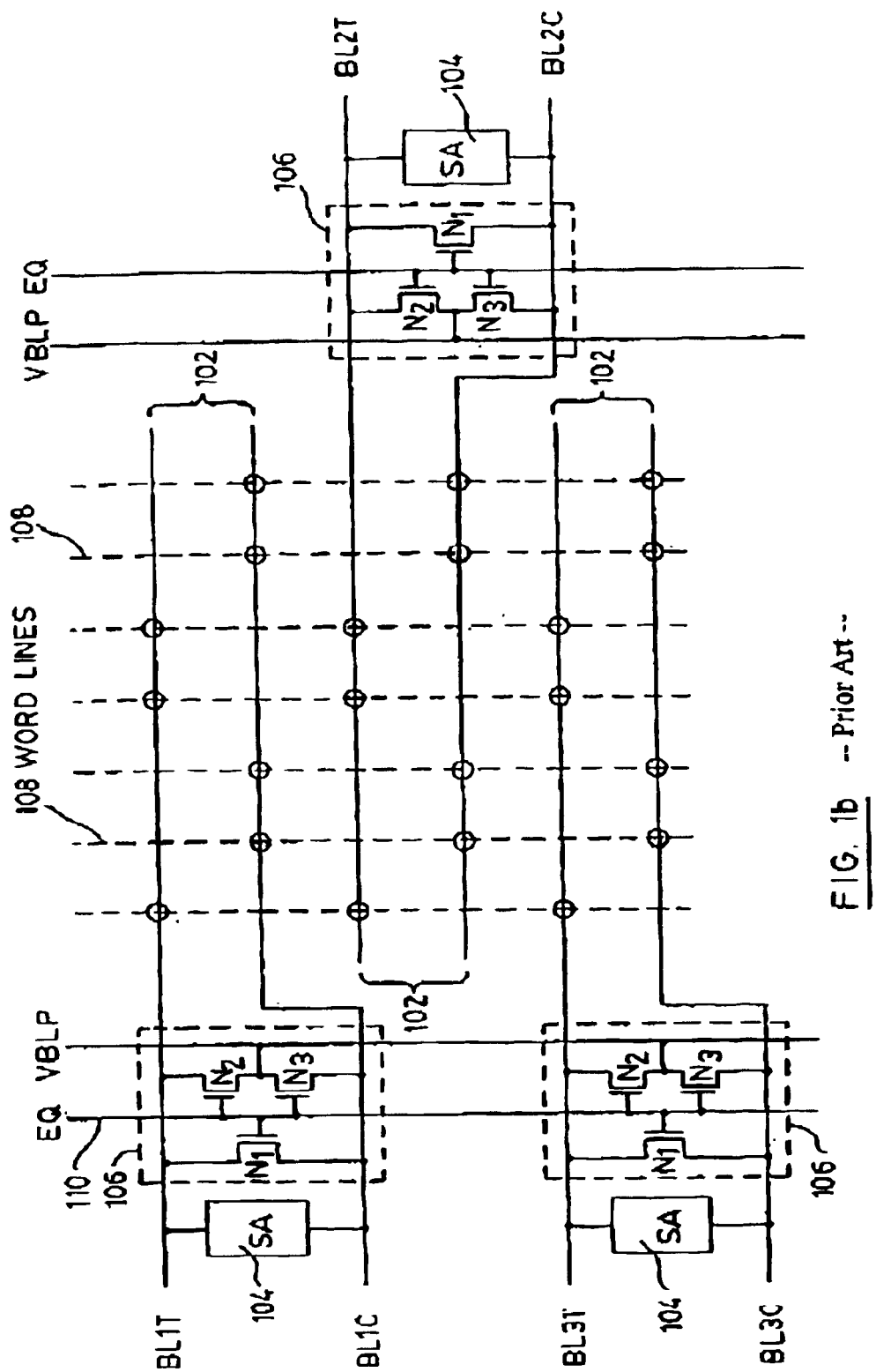
FIG. 1b -- Prior Art --

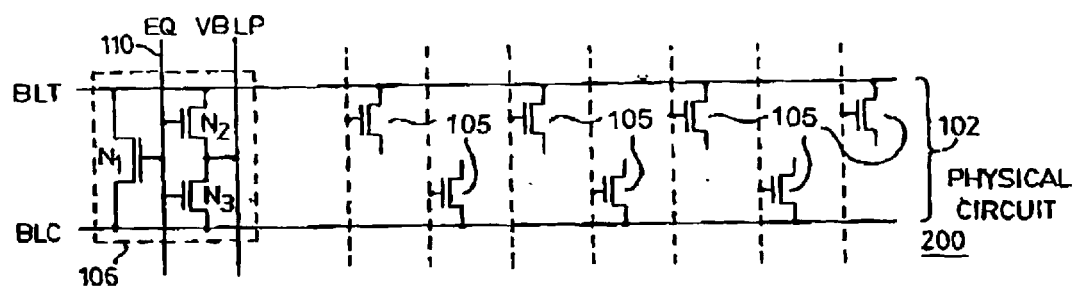
FIG. 2a — Prior Art —
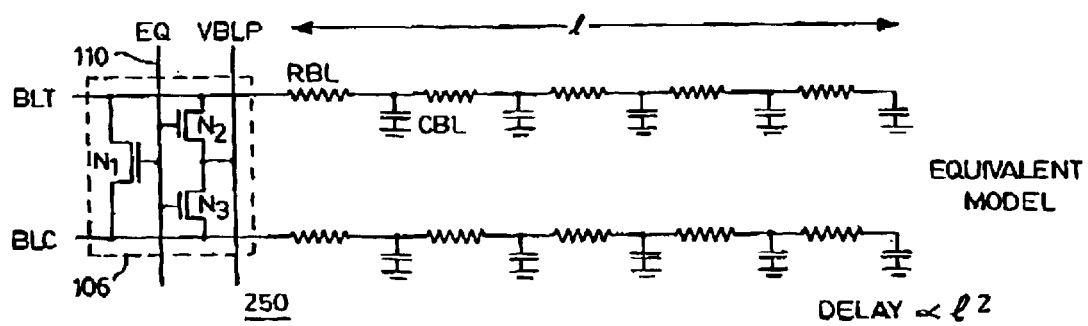
FIG. 2b — Prior Art —

DELAY ∝ $\frac{\ell^2}{4}$

METHOD AND APPARATUS FOR ACCELERATING SIGNAL EQUALIZATION BETWEEN A PAIR OF SIGNAL LINES

This application is a Continuation Application from International Application No. PCT/CA00/01008, filed Aug. 31, 2000, which claims priority from Canadian Application Ser. No. 2,313,951, filed Jul. 7, 2000 and U.S. application Ser. No. 60/216,680, filed Jul. 7, 2000.

The present invention relates generally to a system and method for improving bit line equalization in a semiconductor memory.

BACKGROUND OF THE INVENTION

Traditionally, designers of mass-produced or commodity dynamic random access memory (DRAM) devices have focused more on achieving a lower cost per bit through high aggregate bit density than on high memory performance. Typically, the low cost per bit has been achieved by designing DRAM architectures with sub-arrays as large as practically possible despite its strongly negative affect on the time required to perform bit line pre-charge and equalization, as well as cell read-out, sensing, and writing new values. The reason for the above designs is due to the fact that the cell capacity of a two-dimensional memory array increases quadratically with scaling, while the overhead area of support circuitry increases linearly with scaling. The support circuitry includes bit line sense amplifiers, word line drivers, and X and Y address decoders. Thus, a relatively small increase in overhead area provides a relatively large increase in cell capacity.

The bit line equalization and pre-charge portion of a DRAM row access cycle represents operational overhead that increases the average latency of memory operations and reduces the rate at which row accesses can be performed. Part of the difficulty in reducing this latency is due to typical DRAM architectures, which maximize memory capacity per unit area by favouring large DRAM cell arrays. Large DRAM cell arrays require long bit lines, which are highly capacitive. Thus, the bit lines require a relatively large amount of current to quickly change the voltage on them, as described in U.S. Pat. No. 5,623,446 issued to Hisada et al.

Hisada et al. describe a system for providing semiconductor memory with a booster circuit. The booster circuit boosts the voltage on the gates of the precharge and equalize devices during a selected portion of time in an attempt to decrease the precharge time. However, this approach requires higher power, which is undesirable for many applications.

At the same time, the width of large DRAM arrays requires the simultaneous pre-charge and equalization of thousands of bit lines. The large number of active bit lines limits the drive strength of pre-charge and equalization devices for individual bit line pairs. This is in order to avoid difficulties associated with large peak aggregate currents.

In contrast to commodity DRAM architectures, new DRAM architectures for embedded applications often focus on performance rather than the density. This is achieved by increasing the degree of subdivision of the overall memory into a larger number of sub-arrays. Smaller active sub-arrays permit the use of higher drive, faster pre-charge and equalization circuits than possible in commodity memory devices. A memory of such architecture is illustrated in U.S. Pat. No. 6,023,437 issued to Lee.

Lee describes a semiconductor device wherein the memory in segmented into components and adjacent memories share a sense amplifier. The semiconductor includes a blocking circuit for blocking bit lines associated with the memory component not in use. The semiconductor is capable of reducing the bit line precharge time, by improving the operation of the blocking circuits. However, this approach runs into fundamental limitations regarding how much the bit line equalization period can be shortened due to the distributed resistive and capacitive parasitic characteristics of the bit line material.

Latency impact of slow bit line equalization and precharge has traditionally been minimized by the creation of two different classes of memory operations. A first class comprises bank accesses. Bank accesses require full row or column access in order to access a memory location. A second class comprises page accesses. Page accesses are typically faster than bank accesses and only require column access to a row that has been left open from a previous bank operation. The efficacy of page accesses in reducing average latency is due to the statistical spatial locality in the memory access patterns of many computing and communication applications. That is, there is a strong probability that consecutive memory accesses will target the same row.

However, this architecture is undesirable for many applications such as real time control and digital signal processing that value deterministic, or at least minimum assured levels of memory performance regardless of the memory address access pattern. One solution is to perform a complete row and column access for every memory operation and automatically close the row at the end of the operation. Unfortunately, even the use of a highly subdivided, small sub-array DRAM architecture is performance limited by the distributed resistive-capacitive (RC) parasitic characteristics of the bit line material due to current DRAM design and layout practices.

Therefore, it is an object of the present invention to provide an equalization circuit that obviates or mitigates one or more of the above mentioned disadvantages.

SUMMARY OF THE INVENTION

In accordance with an embodiment of the present invention there is provided a circuit for equalizing a signal between a pair of bit lines. The circuit comprises a first equalizing element that is operatively coupled between the pair of bit lines for equalizing the signal, the first equalizing element being located proximate a first end of the pair of bit lines. The circuit further comprises a precharging element that is operatively coupled between the pair of bit lines for precharging the pair of bit lines to a precharge voltage, the precharging element being located proximate to the first equalizing element. The circuit also comprises a second equalizing element that is operatively coupled between the pair of bit lines for equalizing the signal, and located at a predetermined position along the bit lines. As a result of having multiple equalizing elements located along pairs of bit lines, the precharge and equalize function is performed faster than in conventional approaches.

BRIEF DESCRIPTION OF THE DRAWINGS

Embodiments of the invention will now be described by way of example only with reference to the following drawings in which:

FIG. 1a is a schematic diagram of memory array circuit (prior art);

FIG. 1b is a schematic diagram of an alternate embodiment of the memory array circuit illustrated in FIG. 1a (prior art);

FIG. 2a is a schematic diagram of a bit line pair illustrated in FIGS. 1a and 1b (prior art);

FIG. 2b is a schematic diagram of an equivalent model of the bit line pair illustrated in FIG. 2a (prior art);

FIG. 3b is a schematic diagram of an alternate embodiment of the memory array circuit illustrated in FIG. 3a;

FIG. 4b is a schematic diagram of an equivalent model of the bit line pair illustrated in FIG. 4a;

FIG. 5a is a schematic diagram of yet an alternate embodiment of the memory array circuit illustrated in FIG. 3a; and FIG. 5b is a schematic diagram of an alternate embodiment of the memory array circuit illustrated in FIG. 5a.

DETAILED DESCRIPTION OF THE PREFERRED EMBODIMENTS

Figure 3A:
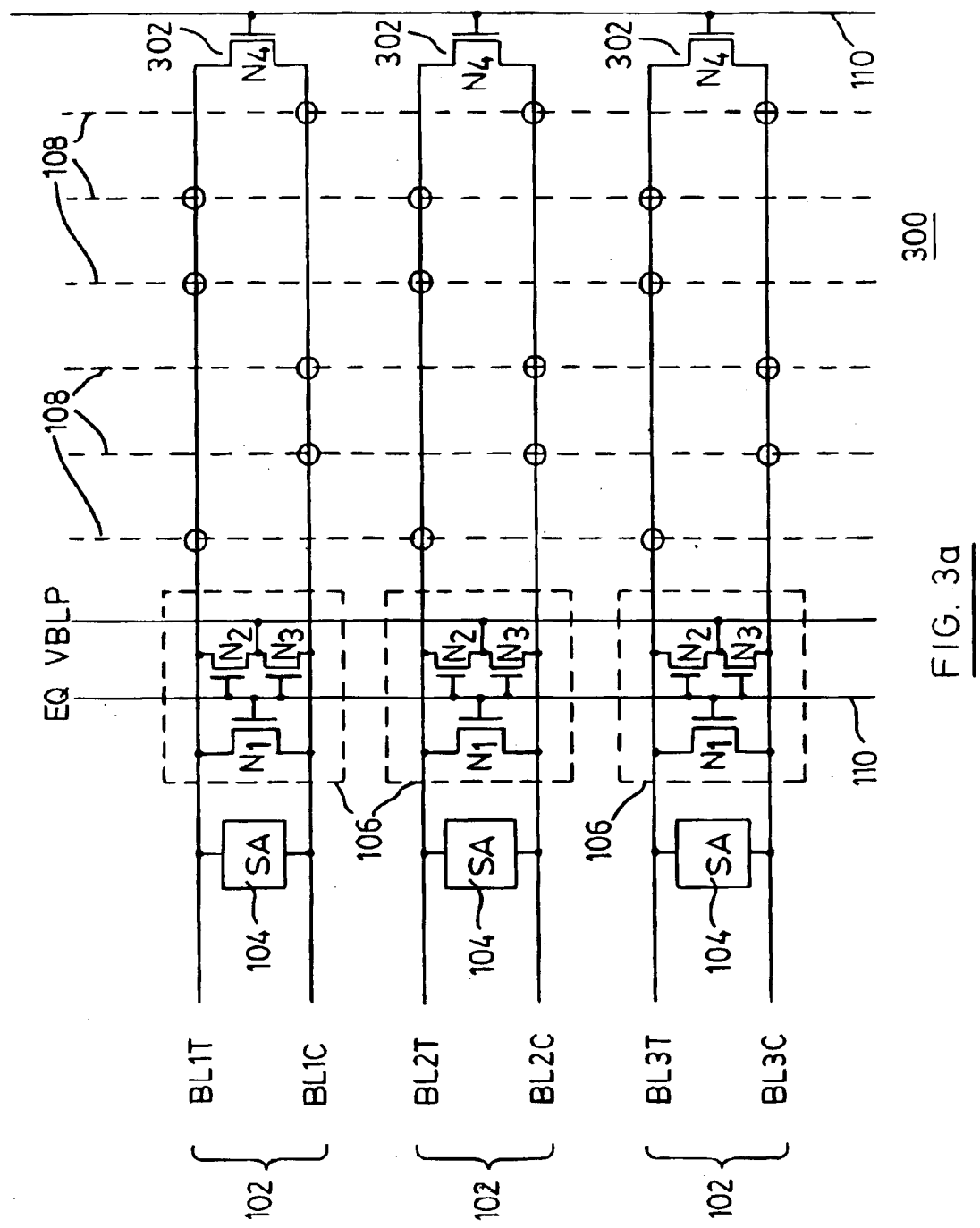
FIG. 3a is a schematic diagram of a memory array circuit in accordance with an embodiment of the present invention.

For convenience, like numerals in the description refer to like structures in the drawings. Referring to FIG. 1a, a bit line precharge and equalization circuit illustrating a prior art DRAM architecture is illustrated generally by numeral 100. The circuit 100 comprises a memory cell array 101, having memory cells located at the intersection of ones of a plurality bit line pairs 102 and word lines 108. Each bit line pair 102 is comprised of a first or true bit line 102a and a second line or complementary bit line 102b. A sense amplifier 104 is operatively coupled between the true bit line 102a and the complementary bit line 102b at one end of the bit line pair 102. A precharge equalization circuit 106 is also operatively coupled between the true bit line 102a and the complementary bit line 102b at the same end of the bit line pair 102 as the sense amplifier 104. Memory cell access transistors 105 are located at word line 108 and bit line 102 intersections for accessing the memory cells.

As may be seen in FIG. 1a, the sense amplifier 104 and the precharge circuit 106 are arranged in circuit 100 to be located together on the same side of the memory cell array for each bit line pair. Alternately, the sense amplifier 104 and the precharge and equalization circuit 106 may be located together on opposite sides of the memory of cell array for adjacent bit line pairs, as shown in FIG. 1b. Furthermore, the sense amplifier 104 and the precharge and equalization circuit 106 may also be located separately on opposite sides of the memory cell array for each bit line pair (not shown).

As is well known, bit line precharge and equalization is performed by the precharge circuit 106. The precharge and equalization circuit 106 comprises three n-channel transistors N1, N2, and N3. The drain and the source of transistor N1 are operatively coupled between the true bit line 102a and the complementary bit line 102b of the bit line pair 102. The gate of the equalization transistor N1 is operatively coupled to an equalization enable line 110.

The drain of transistor N2 is connected to the true bit line 102a of the bit line pair. The source of N2 is connected to both the drain of N3 and a bit line precharge voltage $V_{blp}$ 112. The source of N3 is operatively coupled with the complementary bit line 102b of the bit line pair 102. The gates for both N2 and N3 are operatively coupled with the equalization line 110.

Transistor N1 equalizes the voltage on the associated true 102a and complimentary 102b bit lines, while transistors N2 and N3 drive the true 102a and complimentary 102b bit lines respectively to the precharge voltage level.

During a DRAM read operation, the bit line sense amplifiers 104 sense the voltage difference between the true 102a and complimentary 102b bit lines induced from a read out of an associated charge within an accessed memory cell. The sense amplifier 104 amplifies the voltage difference until the bit line with the higher voltage is raised to approximately the positive supply voltage rail $V_{dd}$ while the bit line with the lower voltage is pulled to approximately the ground supply voltage rail $V_{ss}$. Typically, the bit line precharge voltage $V_{blp}$ 112 is set close to midway between $V_{dd}$ and $V_{ss}$.

Theoretically, only transistor N1 is needed for the precharge voltage because the precharged voltage can be achieved by charge sharing between the true 102a and complimentary 102b bit lines when the two are shorted together through N1. In practice, however, leakage, capacitive coupling, asymmetries in bit line capacitance, and other effects require some current to be supplied through transistors N2 and N3 for restoring the bit line pair 102 to the bit line precharge voltage $V_{blp}$ 112.

Referring to FIG. 2(a), a circuit diagram of a bit line pair 102 is shown generally by the numeral 200. The circuit 200 includes the precharge circuit 106 as well as the memory cell access transistors 105. As previously described the precharge and equalization circuitry, that is transistors N1, N2, and N3, is located at one end of the bit line pair 102. The bit lines have significant distributed RC parasitic characteristics due to the small width of bit lines 102. The bit lines are typically placed as close together as possible in order to achieve a high memory density thus the width of the bit lines is at a minimum, or near minimum value.

Furthermore, the memory cell access transistors 105 attached to the bit lines have an associated drain-capacitance that adds to the distributed RC parasitic characteristics. The RC parasitic characteristics cause an increase in the time required to equalize the bit line pair 102. Therefore, the time needed to equalize and precharge a bit line pair is approximately proportional to the square of the bit line's length within the memory array.

Referring to FIG. 2b, an equivalent model to the circuit illustrated in FIG. 2a is shown generally by the numeral 250. The equivalent model 250 illustrates the resistive and capacitive elements in the memory cell array as resistors and capacitors equivalent to the resistance and capacitance presented by the actual circuit.

Referring to FIG. 3a, a circuit for reducing the time required for precharging a bit line pair according to an embodiment of the invention is illustrated generally by the numeral 300. The circuit includes a plurality of bit line pairs 102, word lines 108, memory cell access transistors 105, and a sense amplifier 104 and a precharge circuit 106 located at one end of each bit line pair 102. The circuit 300 further includes an additional transistor N4 302 located at an end of the bit line pair opposite to the sense amplifier 104 and the precharge and equalization circuit 106.

The drain of transistor N4 is coupled to the true 102a bit line and the source of N4 is coupled to the complimentary 102b bit line. The gate of N4 is coupled to an equalization enable line 110. The addition of transistor N4 effectively halves the length of the bit line as far as the RC delay is concerned and reduces the time needed to perform bit line equalization and precharge time. Typically the equalization and precharge time is reduced by approximately 75% as compared to prior art circuits. The location of transistor N4 is more important than the extra drive that it provides.

Thus, the addition of at least one extra equalization transistor along a bit line pair ensures that the distributed capacitance of the bit line pair and the associated memory cell transistors is more readily overcome with the additional drive provided by the extra equalization transistor(s). Particularly for embedded memory applications, additional area required to implement the extra equalization transistor(s) per bit line pair is readily compensated by the resulting decrease in precharge and equalization timing. This timing decrease, in turn, greatly decreases the overall delay between memory accesses, thereby providing an embedded memory implementation its main advantage over discrete commodity memory implementations.

Figure 3B:
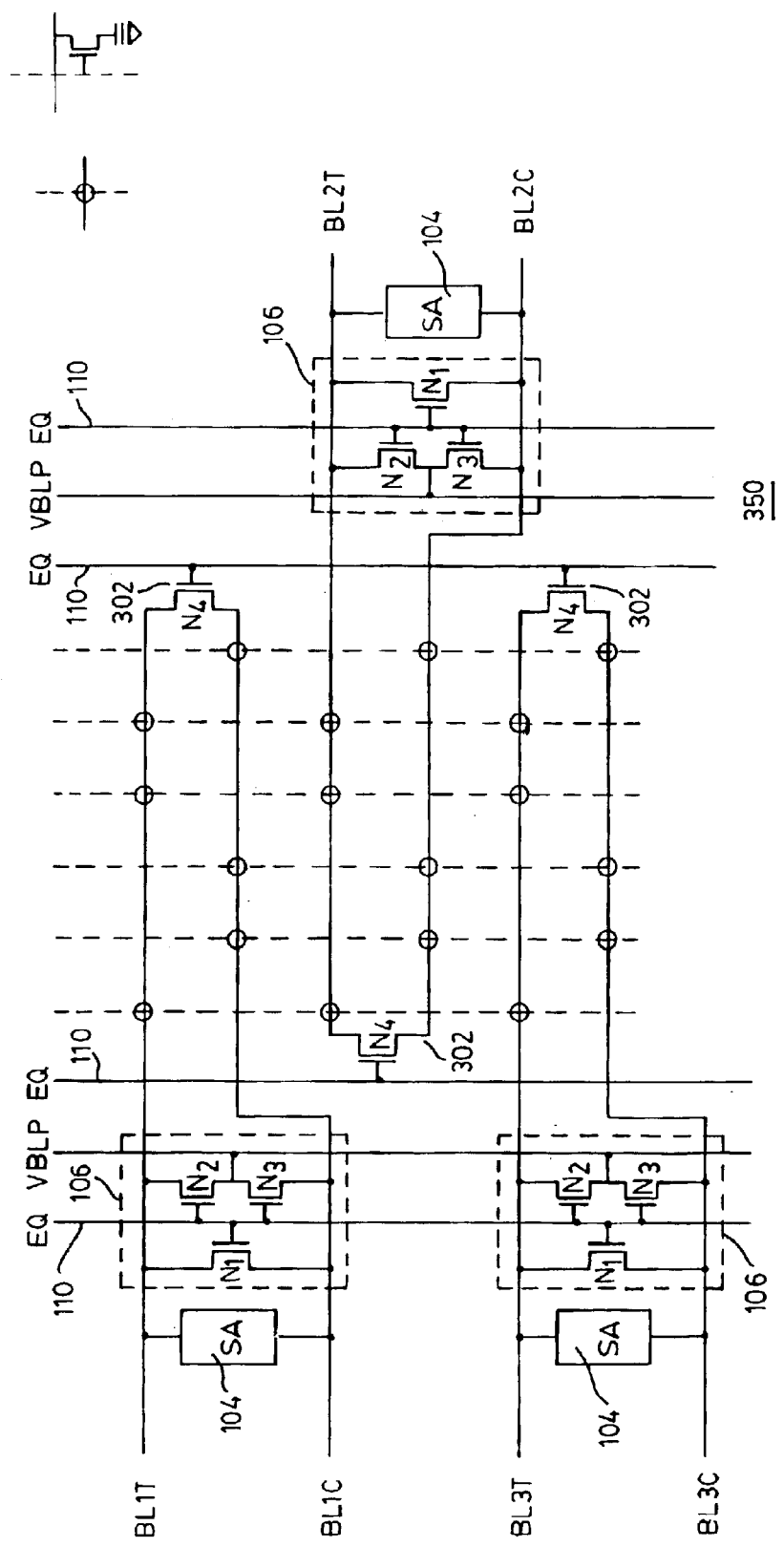

Referring to FIG. 3(b), an alternate embodiment of the above-described circuit is represented generally by the numeral 350. Similarly to FIG. 1(b), the sense amplifier 104 and precharge and equalization circuit 106 for each bit line pair are located together on opposite sides of the memory cell array for alternating bit line pairs. Therefore, the additional transistor N4 is also on opposite sides of the memory cell array for adjacent bit line pairs.

Figure 4A:
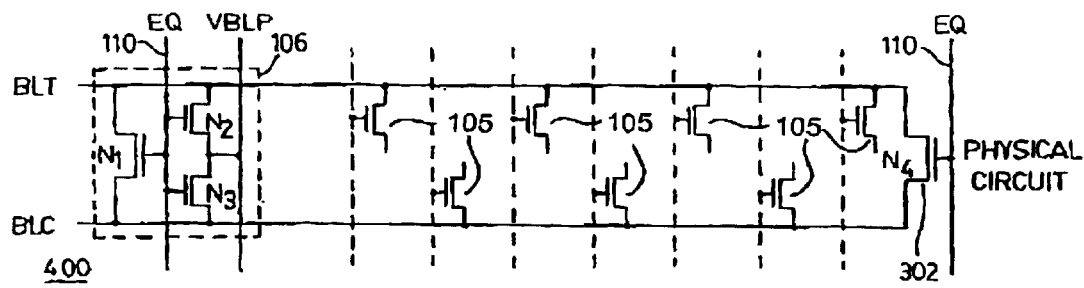
FIG. 4a is a schematic diagram of a bit line pair illustrated in FIGS. 3a and 3b.
Figure 4B:
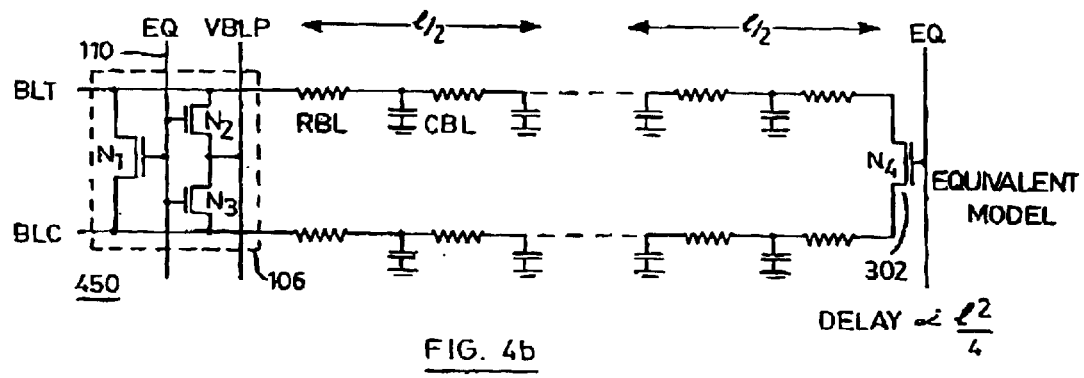

Referring to FIG. 4a, a bit line pair including memory cell access transistors 105 is shown generally by the numeral 400. Referring then to FIG. 4b, an equivalent circuit to that of the physical circuit illustrated in FIG. 4(a) is shown generally by the numeral 450. The equivalent circuit 450 provides a model illustrating the resistive and capacitive elements in the memory cell array as well as the fact that each transistor N1 and N4 is only responsible for equalizing and precharging half the length of the bit line pair. As a result, the delay associated with the precharge and equalize operation becomes proportional to one quarter (¼) the bit line length squared, i.e. delay $\propto$(bit line length)$^2$.

Figure 5A:
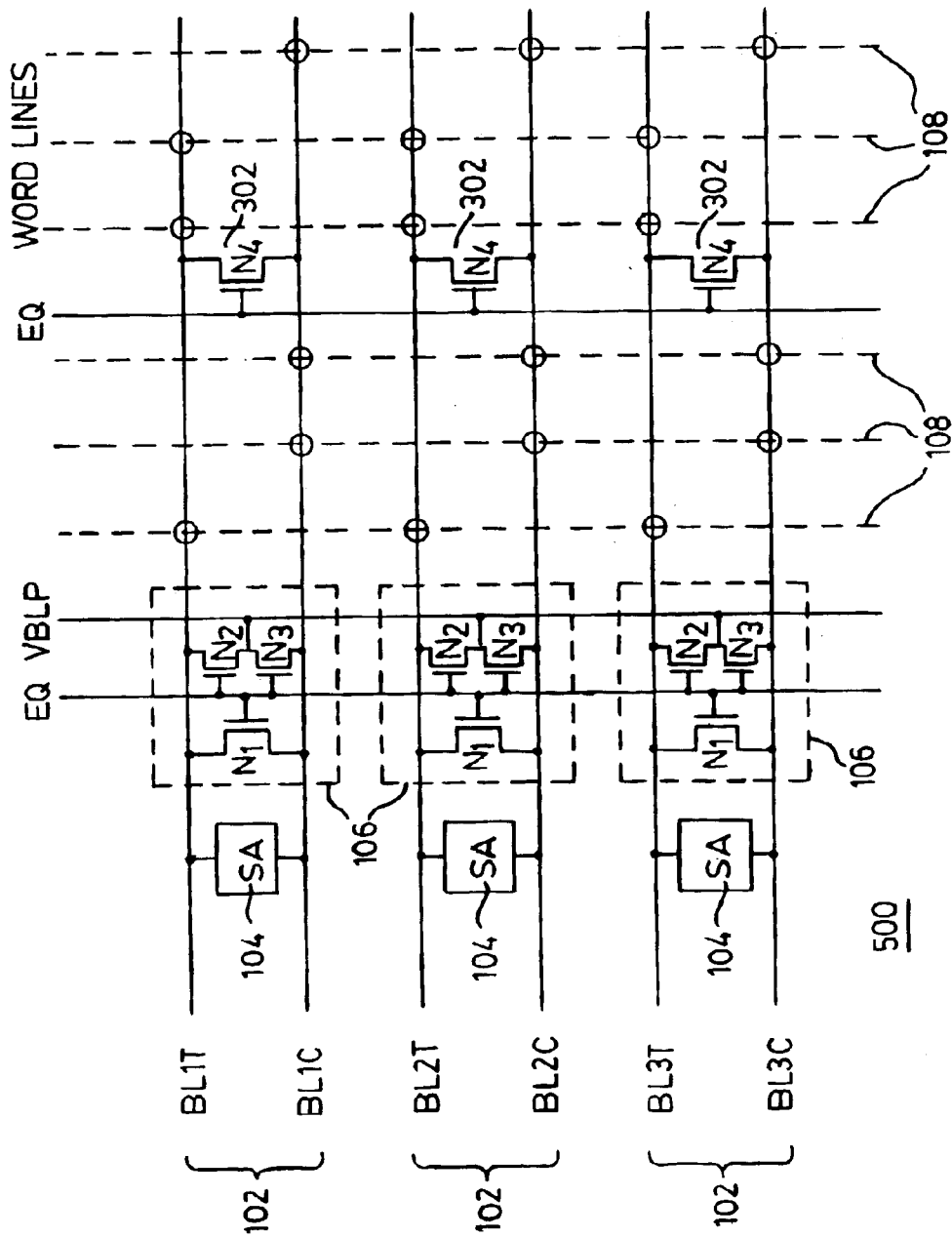
Figure 5B:
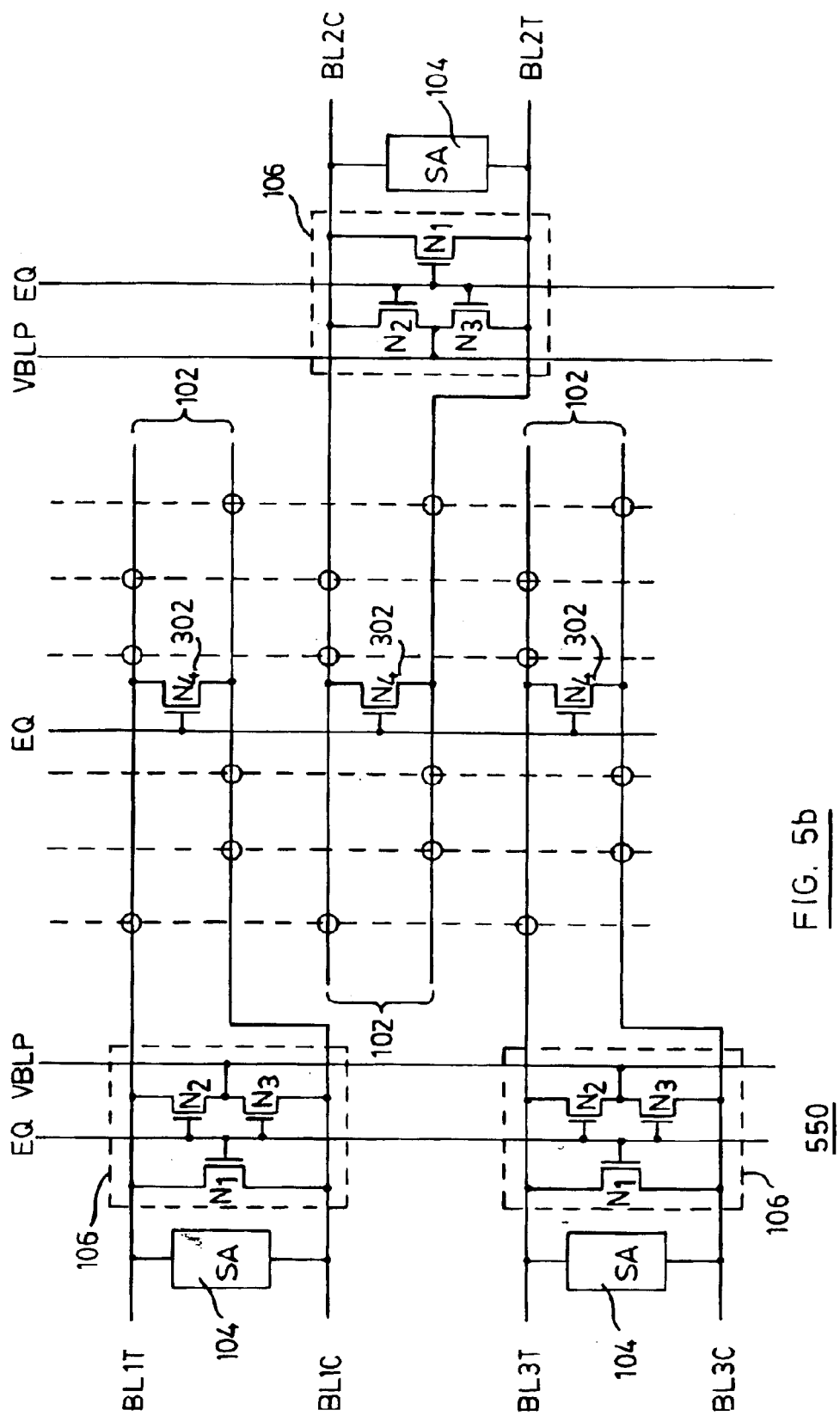

Referring to FIGS. 5a and 5b, further alternate embodiments of bit line pair circuits are illustrated generally by the numerals 500 and 550, respectively. In both FIGS. 5a and 5b, the additional bit line equalization transistor N4 is placed in the middle of the memory cell array. In these cases, the size of transistor N1 may be greatly reduced because it is only needed to compensate for the capacitance of the sense amplifier and column access devices. The central location of transistor N4 is sufficient to cut the effective length of the distributed RC delay of the bit line pair 102 in half, thus allowing the size of transistor N1 to be reduced. Essentially, the equalizing effect of transistor N4 is felt on both sides of the bit line pair due to its central location. As a result, the equalization effect of transistor N1 is decreased compared to the case where transistor N4 is located at the opposite end of the bit line pair. That is, N1 can be decreased in size.

In addition to the configurations shown in FIGS. 5a and 5b, the placement of the additional bit line equalization transistor N4 may also be staggered with each adjacent bit line pair due to the tight spacing within the middle of the array (not shown). By staggering it is meant that the equalization transistors N4 are placed to the left and right of the halfway point for adjacent bit line pairs. The sense amplifier and precharge and equalization transistors N1, N2 and N3 are preferably positioned on the same side as the position of the N4 device, but at the end of the array. This staggered configuration can be used such that the space between bit line pairs does not have to be increased. If the additional bit line equalization transistors N4 were placed directly below each other, the spacing requirements between bit line pairs would increase.

In general, the invention can be applied to other situations where long pairs of data lines are used to transmit data either differentially or dual rail, and the signal pair is equalized between transmission of data items. Such systems include high performance SRAMs, other types of electronic memories that are arranged in arrays, and long, high fan-out data buses within the data paths of digital signal processors and microprocessors.

Although n-channel transistors are used in the above description, it will be apparent to a person skilled in the art to use p-channel transistor. Furthermore, although the invention has been described with reference to certain specific embodiments, various modifications thereof will be apparent to those skilled in the art without departing from the spirit and scope of the inventions as outlined in the claims appended hereto.

What is claimed is:

1. A circuit for equalizing a signal between a pair of bit lines in a memory cell array, said circuit comprising:
   (a) a first equalizing element operatively coupled between said pair of bit lines for equalizing said signal, said first equalizing element being located proximate a first end of said pair of bit lines;
   (b) a precharging element operatively coupled between said pair of bit lines and a precharge voltage for pre-charging said pair of bit lines to said precharge voltage, said precharging element being located proximate to said first equalizing element; and
   (c) a second equalizing element operatively coupled between said pair of bit lines for equalizing said signal, and located at a predetermined position along said bit lines, spaced from said first equalizing element.

2. A circuit as defined in claim 1, wherein said circuit further includes: (a) a memory cell comprising a capacitor and an access transistor for coupling said capacitor to said bit line pair; and (b) a sense amplifier coupled to said pair of bit lines for sensing and amplifying data stored in said memory cell.

3. A circuit as defined in claim 2, wherein said equalizing elements comprise a transistor coupled between said bit line pair and being responsive to an equalization signal.

4. A circuit as defined in claim 3, wherein said precharging element comprises a pair of serially coupled transistors for coupling said precharge voltage to ones of said bit line pair, said serially coupled transistors being responsive to said equalization signal.

5. A circuit as defined in claim 3, wherein said transistors are n-channel transistors.

6. A circuit as defined in claim 4, wherein said serially coupled transistors are n-channel transistors.

7. A circuit as defined in claim 3, wherein said transistors are p-channel transistors.

8. A circuit as defined in claim 4, wherein said serially coupled transistors are p-channel transistors.

9. A circuit as defined in claim 4, wherein said predetermined position of said second equalization element is proximate a second end of said bit lines.

10. A circuit as defined in claim 4, wherein said predetermined position of said second equalization element is proximate a halfway point between said first end and a second end of said bit lines.

11. A circuit as defined in claim 4, wherein said circuit further includes a plurality of bit line pairs.

12. A circuit as defined in claim 1, wherein a time for equalization of said signal is determined by said location of said second equalization element along said bit line.

13. A circuit for accelerating signal equalization between a pair of signal lines, the lines having first and second ends, said circuit comprising: (a) a first equalizing element operatively coupled between said pair of signal lines for equalizing said signal, said first equalizing element being located proximate said first end of said pair of signal lines; (b) a precharging element operatively coupled between said pair of signal lines and a precharge voltage for pre-charging said pair of signal lines to said precharge voltage, said precharging element being located proximate to said first equalizing element; and (c) a second equalizing element operatively coupled between said pair of signal lines for equalizing said signal, and located proximate said second end of said signal lines.

14. A method for accelerating signal equalization between a pair of signal lines, the lines having a first and second ends said method comprising the steps of:

(a) coupling a first equalizing element between said pair of signal lines for equalizing said signal, said first equalizing element being located proximate said first end of said pair of signal lines;

(b) coupling a precharging element between said pair of signal lines and a precharge voltage for pre-charging said pair of signal lines to said precharge voltage, said precharging element being located proximate to said first equalizing element; and (c) coupling a second equalizing element between said pair of signal lines for equalizing said signal, and said second equalizing element being located proximate said second end said signal lines.

* * * * *